(12) United States Patent
Shirley

(10) Patent No.: US 9,900,985 B2
(45) Date of Patent: Feb. 20, 2018

(54) THREE-DIMENSIONAL INTERCONNECT STRUCTURE ADAPTED FOR HIGH FREQUENCY RF CIRCUITS

(71) Applicant: Keysight Technologies, Inc., Minneapolis, MN (US)

(72) Inventor: Timothy E. Shirley, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/366,919

(22) Filed: Dec. 1, 2016

(65) Prior Publication Data

US 2017/0223830 A1    Aug. 3, 2017

Related U.S. Application Data

(60) Provisional application No. 62/289,099, filed on Jan. 29, 2016.

(51) Int. Cl.
*H05K 1/16* (2006.01)

(52) U.S. Cl.
CPC .......... *H05K 1/162* (2013.01); *H05K 1/165* (2013.01); *H05K 1/167* (2013.01)

(58) Field of Classification Search
CPC ......... H05K 1/162; H05K 1/165; H05K 1/167
USPC ......... 174/250, 251, 255–258, 260–262, 264
See application file for complete search history.

(56) References Cited

U.S. PATENT DOCUMENTS

| 7,446,017 | B2 | 11/2008 | Liu |
| 7,589,390 | B2 | 9/2009 | Yao |
| 7,952,196 | B1 | 5/2011 | Iannotti |
| 9,024,417 | B2 | 5/2015 | Sherrer |
| 9,312,589 | B2 | 4/2016 | Sherrer |
| 2008/0205014 | A1 | 8/2008 | Chen |
| 2015/0016068 | A1 | 1/2015 | Liao |
| 2015/0228554 | A1 | 8/2015 | Rollin |

OTHER PUBLICATIONS

Sherrer, An Enabling New 3D Architecture for Microwave Components and Systems, Microwave Journal, Feb. 2008, pp. 66-77.

*Primary Examiner* — Tremesha S Willis

(57) ABSTRACT

A three-dimensional interconnect structure having a top surface, a first coaxial conductor, and a shielded chamber is disclosed. The first coaxial conductor is filled with a solid dielectric medium. The first coaxial conductor has a segment that runs parallel to the top surface and a segment connects the first coaxial conductor to the top surface. Conductive pads on the top surface are adapted to receive a signal and couple that signal to the first coaxial conductor at the top surface. The shielded chamber contains a device connecting two conductors that are part of the three-dimensional interconnect structure to one another in that chamber. The shielded chamber is filled with the solid dielectric medium. The structure is a solid block composed of a mixture of metal structures interspersed with the solid dielectric medium.

15 Claims, 5 Drawing Sheets

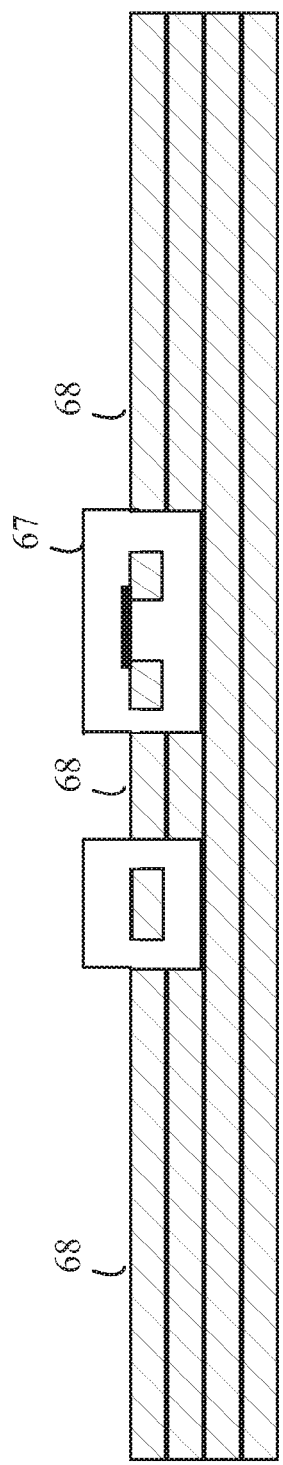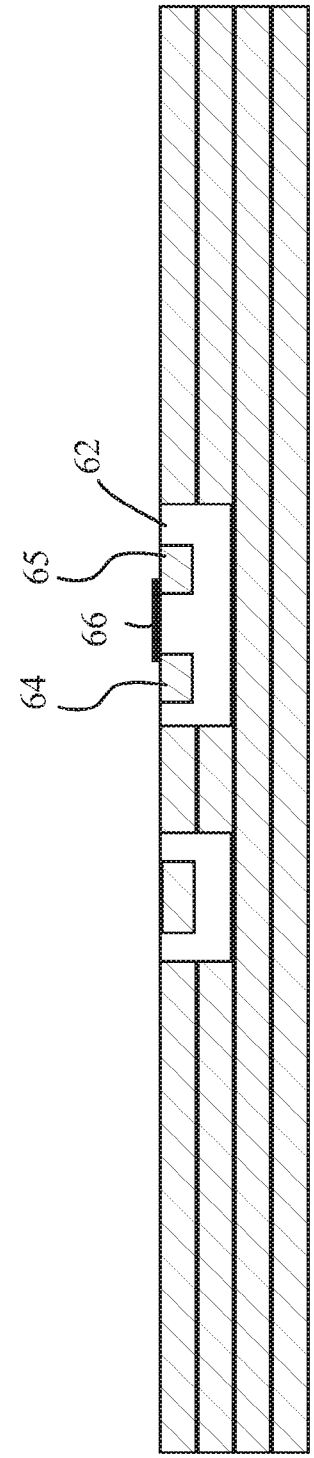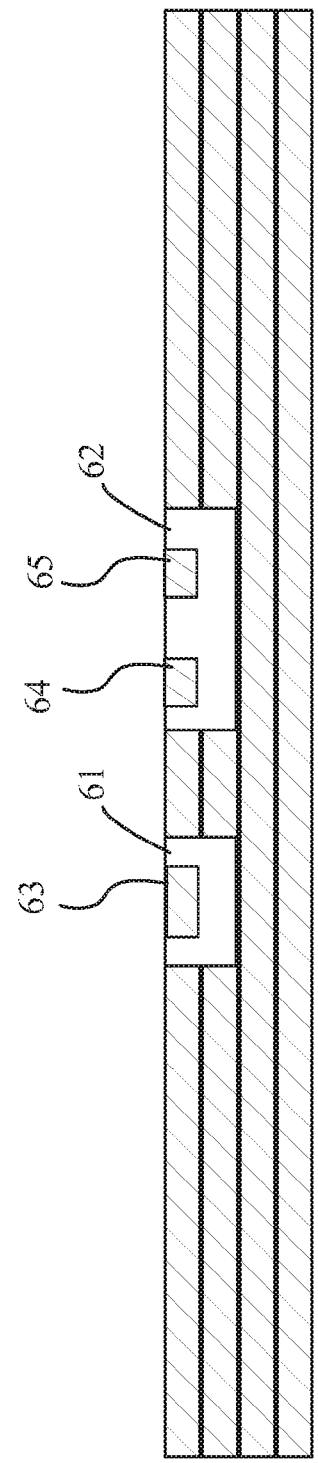

US 9,900,985 B2

THREE-DIMENSIONAL INTERCONNECT STRUCTURE ADAPTED FOR HIGH FREQUENCY RF CIRCUITS

CROSS-REFERENCE TO RELATED PATENT APPLICATIONS

This application is a conversion of, and claims priority therefrom, of U.S. Provisional patent application Ser. No. 32/289,099 filed on Jan. 29, 2016, said patent application being incorporated by reference herein.

BACKGROUND

At very high frequency RF, μWave, or mmWave systems, providing a system on a single integrated circuit (IC) presents significant challenges, since such systems often require different technologies for different components of the system. In addition, the development cycle times and development costs for state of the art custom ICs is often prohibitive for small volume applications that must be sold at low cost.

One solution to this problem is to provide hybrid microcircuits in which a number of components are produced in separate technologies and assembled on some form of substrate. At frequencies above 20 GHz, achieving low loss, good RF matching, and high isolation on printed circuit boards (PCBs) is particularly challenging. The need for high isolation requires that components be placed inside cavities, often having machined lids. This significantly increases the size, weight and cost of the assembly. In addition, providing impedance matching and low loss between components and structures in the PCB presents additional challenges.

BRIEF DESCRIPTION OF THE DRAWINGS

FIGS. 3A-3C illustrate the incorporation of a device into a three-dimensional interconnect structure according to one embodiment of the present invention.

SUMMARY

The present invention includes a three-dimensional interconnect structure having a top surface, a first coaxial conductor, and a shielded chamber. The first coaxial conductor is filled with a solid dielectric medium. The first coaxial conductor has a segment that runs parallel to the top surface and a segment that connects the first coaxial conductor to the top surface. Conductive pads on the top surface are adapted to receive a signal and couple that signal to the first coaxial conductor at the top surface. The shielded chamber contains a device connecting two conductors that are part of the three-dimensional interconnect structure to one another in that chamber. The shielded chamber is filled with the solid dielectric medium.

In one aspect of the invention, the three-dimensional interconnect structure also includes a second coaxial conductor having a segment running parallel to the top surface and at an oblique angle to the segment of the first coaxial conductor that runs parallel to the top surface. The second coaxial conductor is also filled with the solid dielectric medium.

In another aspect of the invention, the three-dimensional interconnect structure is a solid block composed of a mixture of metal structures interspersed with the solid dielectric medium. In another aspect, the metal structures have a minimum dimension of 550 microns.

In yet another aspect of the invention, the top surface of the three-dimensional interconnect structure includes a coaxial shielded IC connection connected to the first coaxial conductor and adapted to couple the first coaxial conductor to an IC connected to the top surface.

In another aspect, the first coaxial conductor has a center conductor that includes copper. In a still further aspect, the outer conductor of the coaxial conductor is constructed from CuW.

In a still further aspect, the solid dielectric has a dielectric constant that is greater than 1 and less than 4. The solid dielectric can include a dielectric chosen from the group consisting of $SiO_2$, polyimides, BCB polymers, Teflon, porous oxides, doped oxides, and spin-on glass. In one exemplary embodiment, the solid dielectric medium includes a mixture of dielectric materials having a thermal coefficient of expansion (TCE) between 12 ppm/° C. and 20 ppm/° C., and the first coaxial conductor includes copper or an alloy thereof. In another exemplary embodiment, the mixture of dielectric materials includes a BCB polymer and/or $SiO_2$. In another aspect, the mixture includes a gas entrapped in the BCB polymer.

In another aspect, the circuit device includes a device chosen from the group consisting of resistors, filters, capacitors, and inductors.

In another aspect, the interconnect structure includes a bottom surface adapted for connecting an IC to a third coaxial conductor.

DETAILED DESCRIPTION

Figure 1:
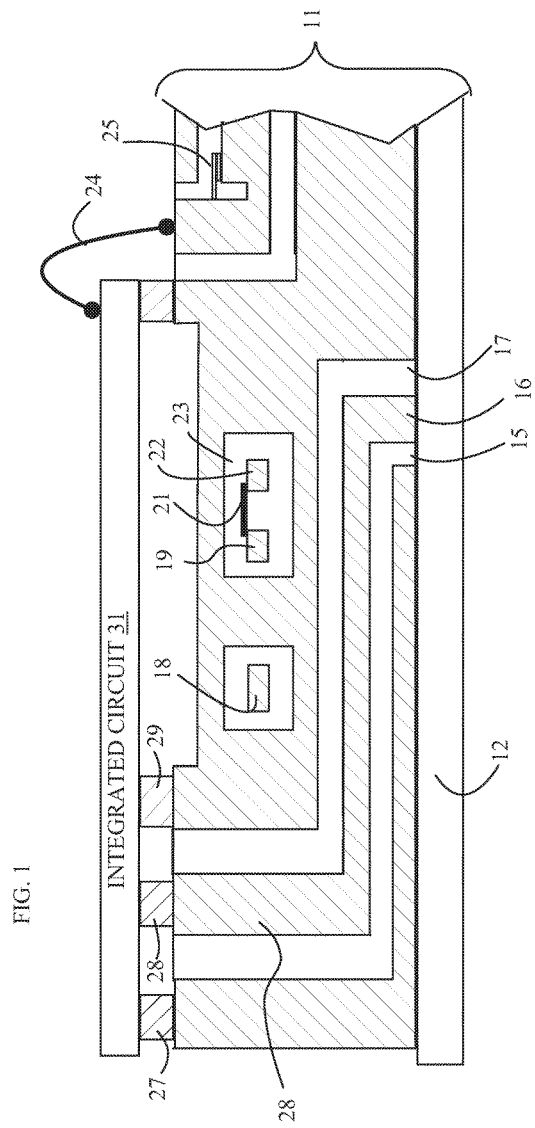
FIG. 1 is a cross-sectional view of a portion of a three-dimensional interconnect structure according to one embodiment of the present invention connected to an IC.

The manner in which the present invention provides its advantages can be more easily understood with reference to FIG. 1, which is a cross-sectional view of a portion of a three-dimensional interconnect structure 11 according to one embodiment of the present invention connected to IC 31. It is assumed that IC 31 operates at very high frequencies. IC 31 is connected to various other components in a larger circuit by three-dimensional interconnect structure 11. The larger circuit can include passive components constructed with the three-dimensional interconnect structure as well as other ICs and/or surface-mounted components connected to a surface of the three-dimensional interconnect structure.

In one aspect of the invention, the signal conductors are arranged as three-dimensional coaxial conductors that run both horizontally and vertically. The center conductor of a horizontally running coaxial conductor that runs perpendicular to the plane of the drawing is shown at 18. A second coaxial conductor that runs both horizontally and vertically has a center conductor shown at 16 that is surrounded by dielectric material shown at 15 and 17. The outer conductor of the coaxial conductor is provided by the surrounding metal layers. The connection to IC 31 between the coaxial conductor and IC 31 is provided by bumps 27-29. It should be noted that the coaxial conductor is maintained to the surface of IC 31 to provide impedance matching and reduce artifacts that would be encountered if a single conductor was used to make the connection in question. This arrangement also minimizes radiation losses from the connection, and hence, provides better signal shielding. In the example shown in FIG. 1, the coaxial conductor terminates on substrate 12 that can also include an IC or other components.

Connections between three-dimensional interconnect structure 11 and IC 31 can be made by bumped through-chip via interconnections. In this case, IC 31 is mounted face up with the connections made by bumps on the backside of IC 31. The connections can also be made by bumps or other flip-chip connections in which case IC 31 is mounted face down. Also, the connections can be made by wire bonds such as wire bond 24, or by a combination of these approaches. Wire bond 24 connects a pad on the upper side of IC 31 to a corresponding connection pad on the surface of three-dimensional interconnect structure 11.

The larger circuit of which IC 31 is a part often includes passive devices such as resistors, inductors, capacitors, couplers, and filters. In PCB-based circuits, these devices are placed on the surface of the PCB. However, because of the high frequencies involved, the components can become radiators of RF energy, and hence, must be shielded from other components. Providing this shielding presents significant challenges as the devices in question must be enclosed in a shielding cavity, which is typically provided by constructing a series of conducting walls around the component areas and placing a conducting roof over the devices to form a cavity. While this solution provides the desired isolation, the cost represents a significant fraction of the overall device cost. In addition, placing these components on the surface of the PCB increases the size and weight of the final device.

The present invention overcomes these problems by providing shielded cavities within the three-dimensional interconnect structures that house circuit elements that are constructed in the three-dimensional interconnect structure during the fabrication of that structure. For example, conductors 19 and 22 are connected by a component 21 within a closed cavity 23 that is filled with dielectric. Similarly, a capacitor 25 can be connected to two conductors within the three-dimensional interconnect structure and coupled to IC 31 by a wire bond 24.

Figure 5:
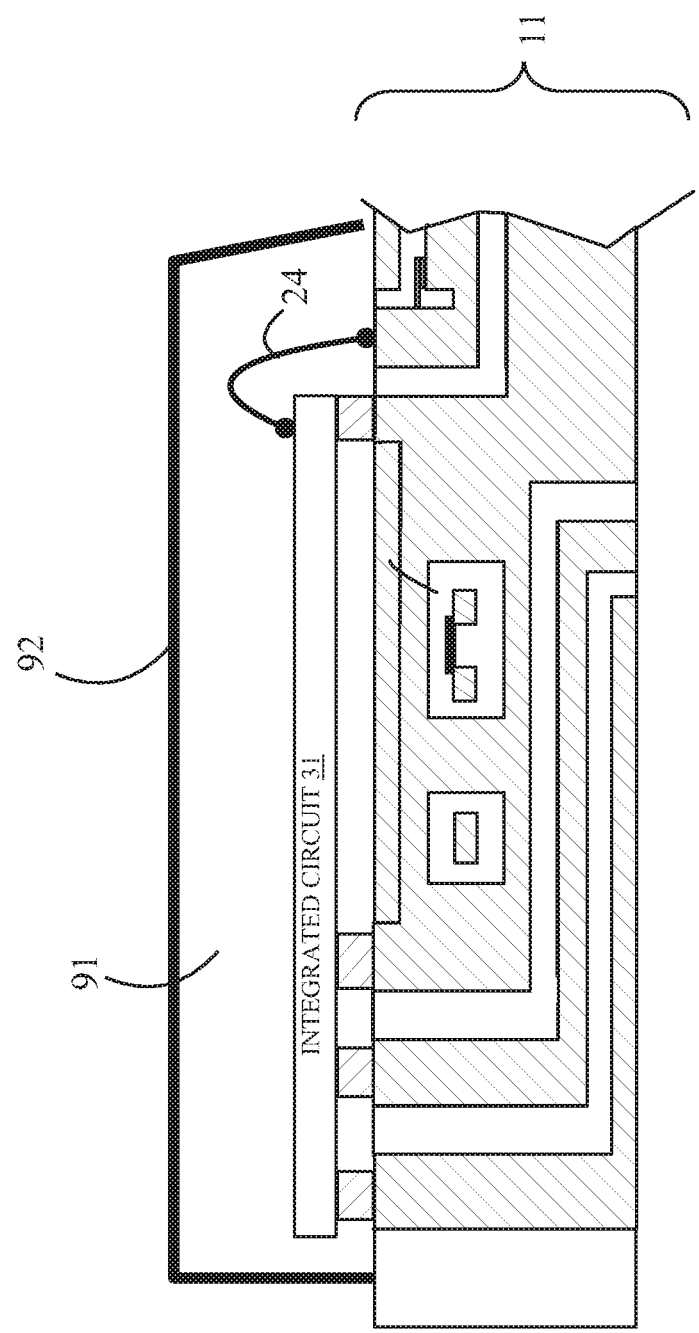
FIG. 5 illustrates one supplemental shielding method for shielding surface components that radiate energy.

If structures or components on the top surface of three-dimensional interconnect structure 11 require shielding to prevent radiation, additional shielding may be required. For example wire bond 24 could transmit a signal at a high enough frequency to require shielding of that wire bond connection. Refer now to FIG. 5, which illustrates one supplemental shielding method for shielding surface components that radiate energy. In this arrangement, a layer of dielectric 91 is deposited over IC 31 and other structures on the top surface of three-dimensional interconnect structure 11 such as wire bond 24. A layer of metal 92 is then deposited over the layer of dielectric and connected to a ground conductor that is accessed on the top surface of three-dimensional interconnect structure 11.

For components that are mounted on the top surface of three-dimensional interconnect structure 11 under IC 31 or for structures contained on IC 31, IC 31 can include metal and/or conductive semiconductor ground planes that form a shield over the components and connects to a ground structure in three-dimensional interconnect structure 11.

Structures such as resonators, filters or couplers having a gaseous dielectric require significantly greater area than structures having a solid dielectric, as the dielectric constant of gaseous dielectrics is much lower. In addition, the solid dielectric of the present invention is compatible with hermetically sealing the structure and provides significantly greater mechanical strength and resistance to vibration. Finally, the solid dielectric provides a substrate on which passive devices such as resistors and capacitors can be fabricated in the course of fabricating the three-dimensional interconnect structure.

Figure 2C:
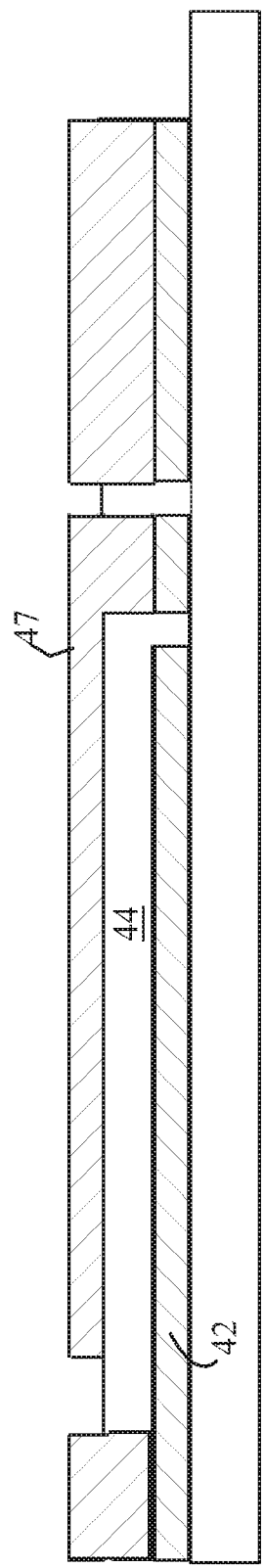
FIGS. 2A-2C illustrate one method for depositing and patterning the various layers that make up one embodiment of a three-dimensional interconnect structure according to the present invention.
Figure 2B:
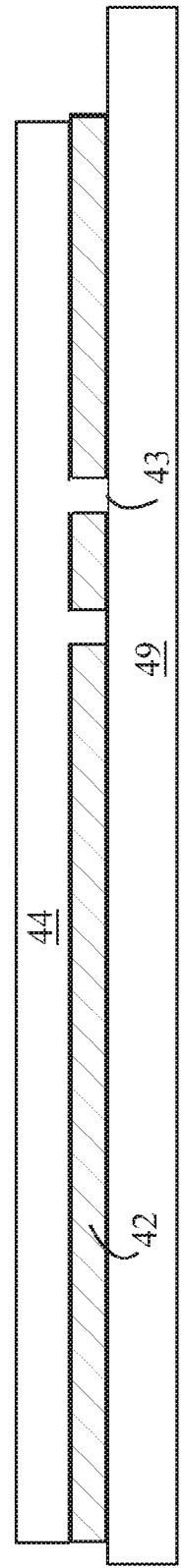
Figure 2A:
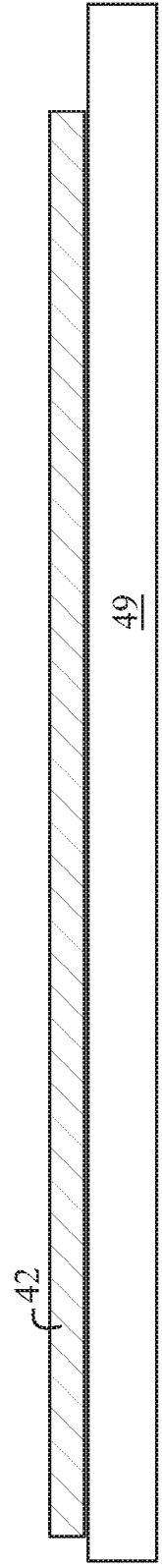

The manner in which a three-dimensional interconnect structure according to the present invention can be constructed can be more easily understood with reference to FIGS. 2A-2C which illustrate one method for depositing and patterning the various layers that make up one embodiment of a three-dimensional interconnect structure according to the present invention. In this aspect of the present invention, a number of alternating metal and dielectric layers are deposited. Each layer is planarized and patterned prior to the deposition of the next layer. Solid metal structures having a thickness greater than the thickness of a single metal layer are constructed by exposing a previous metal layer through the overlying dielectric layer so that the next metal layer continues the growth of the previous metal layer in the exposed regions. Similarly, solid dielectric structures having a thickness greater than one layer are constructed by exposing a previous dielectric layer through an opening in the underlying metal layer so that the next dielectric layer continues the growth of the previous dielectric layer.

Referring to FIG. 2A, the three-dimensional interconnect structure is constructed on a substrate 49 that can be part of the final part or sacrificed at a later stage in the product construction phase to allow other ICs or components to be joined to the three-dimensional interconnect structure. A metal layer 42 is then deposited on substrate 49. The metal layers of the present invention are relatively thick to provide good heat conduction and low electrical loss. The preferred metal is copper or an alloy thereof. The layer can be deposited by first depositing a seed layer and then growing a thicker layer of copper on top of the seed layer by plating. The deposited layer is optionally planarized after deposition to provide a flat surface for the next layer that will be deposited on this layer.

Referring to FIG. 2B, metal layer 42 is patterned and etched to provide openings that expose the underlying substrate layer such as opening 43. A new layer 44 of dielectric is deposited over the patterned layer and planarized. Layer 44 connects with substrate 49. The process is now repeated to provide the next metal layer. Referring to FIG. 2C, layer 44 is patterned to expose the underlying metal layer 42 in regions in which a continuous metal structure is to be generated. A second metal layer 47 is then deposited and patterned. In areas in which the underlying metal layer is exposed through the dielectric layer, the metal layer can be grown directly on the underlying metal layer. In areas in which the new metal layer must be grown on the surface of the dielectric layer, a seed layer may be required before growing the thicker metal layer.

Alternative fabrication methods may also be used. One alternative starts by depositing a uniform layer of dielectric material directly on substrate 49 via a spin coating or other deposition technique. Openings are then etched in this dielectric layer wherever a metal feature is desired. After etching, a plating seed layer of metal and possibly a barrier layer are deposited over the surface of the dielectric layer and the sidewalk of the openings in that dielectric layer. The etched regions of the dielectric are then filled with a suitable metal such as copper by plating. The plating will occur in both the etched holes and on the field regions. Once enough metal has been plated to completely fill the etched holes in the dielectric, plating is halted. The composite substrate is then planarized using a planarization process such as chemical mechanical polishing to remove the metal in the field regions but the metal in the etched dielectric holes remains. This planarization process stops once all of the metal in the field regions has been removed and the surface of the dielectric layer has been exposed. Next, another uniform layer of dielectric material is applied and etched to create holes where the next layer of metal will be formed. These holes are filled with metal and planarized as described above. This process is repeated until the required number of layers has been formed.

Many high frequency circuits include circuit elements that are separate from the ICs. These elements include resistors, filters, capacitors, inductors, couplers, or other passive structures. In conventional PCB-based systems, these elements are placed on the surface of the PCB in areas adjacent to the ICs and connected through traces on the PCB. As noted above, these elements often radiate RF energy, and hence, must be shielded from the rest of the circuitry. The shielding requires that a conductive chamber be constructed around the circuit elements having walls and a roof. Such structures are expensive to fabricate. In addition, attaching these structures to the PCB presents additional challenges that further increase the cost of the final product.

In one aspect of the present invention, these devices are fabricated or mounted in dielectric filled chambers during the process of fabricating the three-dimensional interconnect structure. Refer now to FIGS. 3A-3C, which illustrate the incorporation of a device into a three-dimensional interconnect structure according to one embodiment of the present invention. FIGS. 3A-3C are cross-sectional views of a portion of a three-dimensional interconnect structure at different steps in the fabrication of the three-dimensional interconnect structure. Refer now to FIG. 3A. At this stage in the fabrication of the three-dimensional interconnect structure, a number of layers have been deposited and planarized. The top layer includes two dielectric chambers 61 and 62 that include conductors 63-65 that are running perpendicular to the plane of the figure. Conductor 63 will eventually become the center conductor of a coaxial conductor. In this example, conductors 64 and 65 are to be connected by an element such as a resistor.

Prior to the deposition of the next conductive layer, the resistor will be placed on the surface of dielectric chamber 62 and connected to the conductors. The device can be constructed in place if it can be constructed by conventional metal and dielectric deposition steps. Alternatively, the device can be constructed separately and connected to the conductors. The connections can be provided by depositing conductive metal to form the connections or by wire bonding.

FIG. 3B shows the three-dimensional interconnect structure after device 66 has been placed between conductors 64 and 65 and connected to the conductors. It should be noted that device 66 is supported by the dielectric material which remains in place in the final three-dimensional interconnect structure. In contrast, if a gaseous dielectric were utilized, device 66 would be suspended and subject to mechanical stresses and potential acoustical resonances that could introduce low frequency signal artifacts as well as limiting the lifetime of the product due to the rupture of the device.

Referring to FIG. 3C, after the device has been connected to the appropriate conductors, a new layer of dielectric 67 is deposited which encapsulates the device. Dielectric layer 67 is planarized and etched to expose the underlying metal layer in areas 68 in which the metal structure is to continue upward in the three-dimensional interconnect structure. Additional metal and dielectric layers are then grown as described above.

Filter structures having a coaxial geometry can also be constructed by patterning the center conductor of a coaxial structure and also varying the distance between the center conductor and the walls of the outer conductor. Coupled line filter structures can also be formed in the dielectric cavities of this three-dimensional interconnect system. To provide good performance at very high frequencies, the center conductor and dielectric layers must be much thicker than the thickness of conventional metal and dielectric layers in integrated circuits. The optimum layer thicknesses depend on the dielectric chosen, but are typically on the order of 50 microns. With a two-level coaxial structure, the overall structure thickness is preferably greater than 550 microns. Additionally, the required dimensional tolerances of the metal and dielectric features are tighter than available in conventional printed circuit board technologies. Dimensional tolerances are preferably significantly better than 1 micron.

The minimum number of individual layers in any particular three-dimensional interconnect structure is determined by the complexity of the interconnects and the number of devices that are incorporated in the three-dimensional interconnect structure. In one aspect of the invention, the three-dimensional interconnect structure includes a routing structure that allows signals to travel along fully shielded coaxial conductors in two directions parallel to the top surface of the three-dimensional interconnect structure while crossing over one another and connecting to ICs or other devices on the top and, optionally, bottom of the three-dimensional interconnect structure. To simplify the following discussion, coaxial conductor segments that run parallel to the top surface of the three-dimensional interconnect structure will be said to be running horizontally, and coaxial conductor segments that run perpendicular to the top surface of the three-dimensional interconnect structure will be said to be running vertically. Referring to FIG. 1, horizontally running segments of coaxial conductors are shown at 18 and 27. Vertically running segments of coaxial conductors are shown at 28 and 29. To accommodate two layers of horizontally running coaxial conductors, a minimum of nine layers must be deposited; however, a three-dimensional interconnect structure constructed from significantly more layers may be needed in any particular application.

As noted above, the preferred metal for the metal layers is copper or an alloy thereof. The choice of dielectric is more complex. As noted above, the dielectric material reduces the size of the coaxial structures compared to coaxial structures constructed from a gas such as air. Hence, a dielectric with a dielectric constant of greater than 1 is preferred; however, a very high dielectric constant results in structures that are too small and lead to unacceptable losses. As a result, a dielectric constant that is greater than 1 and less than 4 is preferred. Examples of dielectrics that could be used include $SiO_2$, polyimides, Benzocyclobutene-based (BCB) polymers, Teflon, porous oxides, doped oxides, and spin-on glass. For the purposes of this discussion, a dielectric layer is defined to exclude gas or vacuum dielectrics with the exception of Nano-porous materials.

While there are multiple advantages to picking a gaseous or vacuum dielectric, there are a number of disadvantages that are avoided with a solid dielectric. For example, a gaseous dielectric structure has lower mechanical robustness, microphonics from the vibration of the transmission line's center conductor, longer wavelengths leading to larger structures for components such as filters. In addition, a hermetic seal is difficult to achieve, and hence, such devices are prone to debris entering the air gaps causing shorts or altering performance. In addition, corrosion of the exposed surfaces can occur. Such structures also lack a convenient substrate on which to form passive structures like resistors and capacitors.

The deposition process involves heating and cooling of the stack of layers. Fabrication and assembly temperatures can range from room temperature to at least 260° C. In addition, the final device may be subjected to an operating temperature as low as −40° C. Hence, a dielectric that more nearly matches the coefficient of thermal expansion of copper is preferred to ensure that the layers do not separate during the heating and cooling process due to the stresses resulting from a mismatch in the thermal coefficient of expansion. In addition, porous layers can accommodate differences in thermal expansion by providing space for the dielectric to expand. Copper has a TCE of about 16 ppm/° C.; hence, dielectrics having a TCE around 16 ppm/° C. are preferred. Polyimide dielectrics can be formulated to have thermal coefficients of expansion around 20 ppm/° C.; however, these dielectrics tend to have poor electrical characteristics, in that coaxial conductors with such dielectric are lossy. BCB polymers have good electrical properties; however, the thermal coefficients of expansion for these materials are about 40 ppm/° C. at room temperature and larger at elevated temperatures.

One method of providing a dielectric with the desired characteristics is to use a material that is a mixture of two dielectrics at ratios such that the average TCE matches that of copper. For example, $SiO_2$ nanospheres have a very low coefficient of thermal expansion, e.g. 0.5 ppm/° C. Hence a mixture of such nanospheres with a BCB polymer can provide the desired coefficient of thermal expansion while providing good electrical properties. A BCB polymer with entrapped gas bubbles can also be used. The gas bubbles also provide room for the BCB polymer to expand when the layer is at elevated temperatures.

An alternative method for mitigating the problems introduced by having a dielectric with a substantially different TCE than the copper used for the center conductors of the coaxial conductors is to use a two metal embodiment. The metal component of the interconnect structure serves two functions. The first is signal conduction, and the second is heat conduction. The coaxial conductors are formed from an inner conductor that has a much smaller cross-section than the outer conductor. Hence, having good signal conduction is most critical for the inner conductor. That is, the outer conductor is often part of a larger conducting layer that also provides heat conduction and the shielding walls of internal chambers. Hence, the outer conductor and the other metal structures that do not provide signal paths or have much larger cross-sectional areas can be constructed from another metal that has a better TCE match to that of the dielectric material. The inner conductor of the coaxial conductors is constructed from a second material that has much higher conductivity, and hence, lower losses. Similarly, non-coaxial conductors that provide high speed signal paths could be constructed of this higher conductivity metal. Since the cross-sectional area of the conductors that provide such signal paths is much smaller, these signal paths can accommodate more stress from temperature differences.

In such an embodiment, each layer in the fabrication process would consist of patterned dielectric sections with two different metals in the openings in the dielectric. In one exemplary embodiment, the high conductivity signal paths are constructed from copper and the less conductive metal structures are constructed from CuW, which still has sufficient electrical conductivity to provide the outer conductor of the coaxial conductors while providing a better TCE match to silicon dielectrics.

Figure 4:
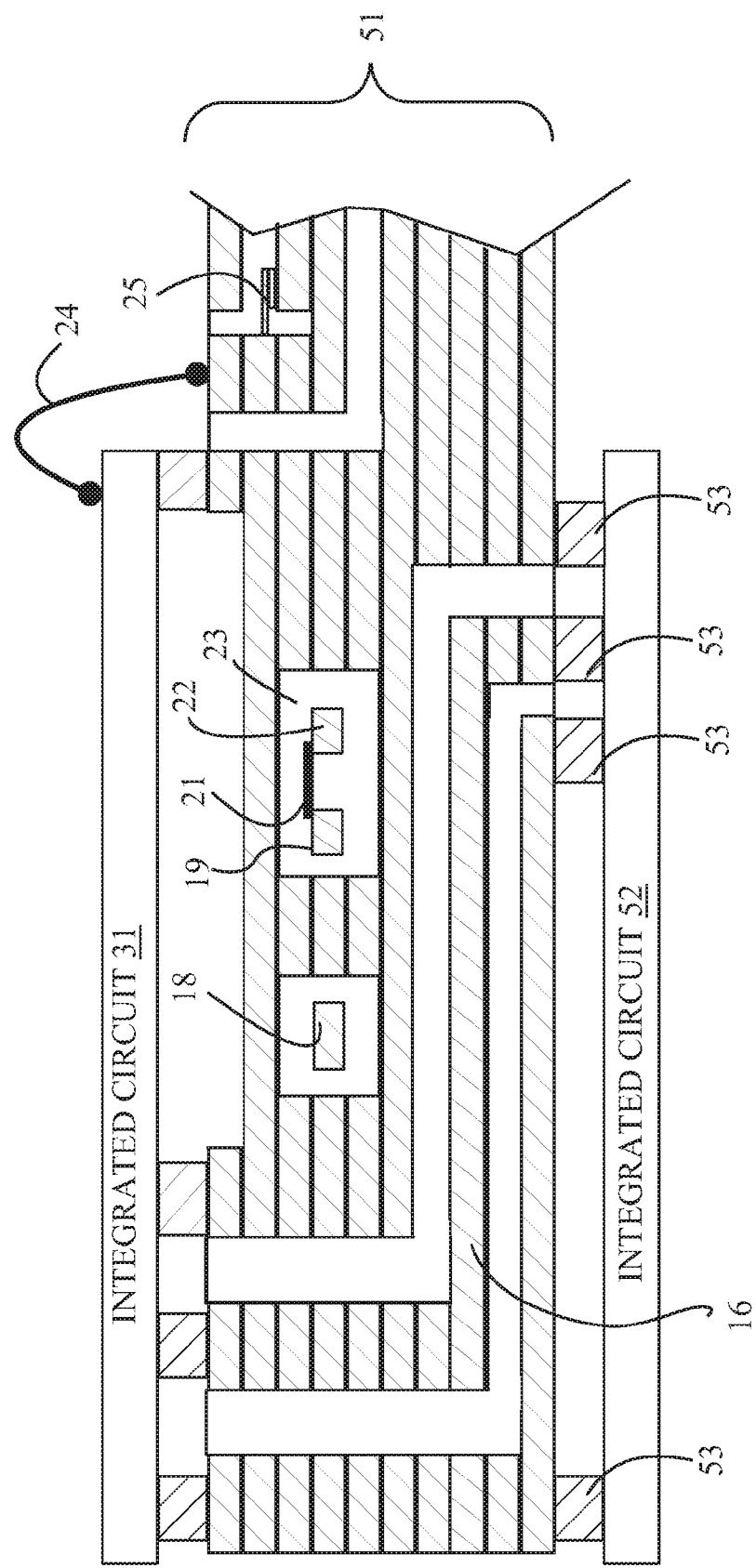
FIG. 4 illustrates a circuit having two ICs attached to different surfaces of a three-dimensional interconnect structure according to one embodiment of the present invention.

The three-dimensional interconnect structure is constructed on a substrate such as substrate 12 shown in FIG. 1. The substrate can be left in place after the layers are fabricated or removed. Exemplary substrates can be constructed from silicon, GaN, SiC, GaAs, sapphire, or PCBs. If the substrate is removed, additional ICs can be directly attached to the bottom surface of the three-dimensional interconnect structure, or the three-dimensional interconnect structure can be attached to other useful structures such as a PCB or coaxial connectors. Refer now to FIG. 4, which illustrates a circuit having two ICs attached to different surfaces of a three-dimensional interconnect structure according to one embodiment of the present invention. In the arrangement shown in FIG. 4, the individual layers used to construct the three-dimensional interconnect structure are explicitly shown; however, it is to be understood that the metal layers in locations that overlie one another are fused to form a continuous solid metal structure. To simplify the drawing, those elements that serve functions analogous to those served by corresponding elements in FIG. 1 have been given the same numerical designations. In this embodiment, substrate 12 shown in FIG. 1 has been removed and IC 52 has been bonded to the three-dimensional interconnect structure 51 by the solder bumps shown at 53. IC 52 is connected to IC 31 by a coaxial transmission line having center conductor 16. It should be noted that this coaxial transmission line is fully shielded between the ICs.

The above-described examples show only one IC connected to each of the surfaces of the three-dimensional interconnect structure. However, it is to be understood that many more ICs could be mounted on each surface and could be connected by coaxial transmission lines that run through the three-dimensional interconnect structure. These coaxial transmission lines have segments that are both parallel to and perpendicular to the surface of the three-dimensional interconnect structure so that the signal lines do not include any non-shielded segments.

The fused metal layers of the present invention are relatively thick compared to the layers in a PCB. In addition to providing the various signal and ground paths, the continuous metal structures that are several layers thick provide heat conduction paths for moving heat from the integrated circuit and other components to a portion of the three-dimensional interconnect structure that can couple that heat to the environment. In one exemplary embodiment, the thickness of the metal layers is greater than 550 microns.

The features provided by the present invention cannot be provided by a conventional PCB because PCBs have metal layers that are separated from each other by dielectric layers. Hence, to provide a vertically running conductor, the conductor must be formed from a vertically running via that is filled with metal. The via is provided by drilling through the PCB layers. To provide an approximation to a vertically running coaxial transmission line, the outer conducting ring must be formed by drilling a large number of vertically running holes around the center vertical conductor. The outer conductor holes cannot join each other to provide a continuous outer ring, as this would compromise the integrity of the attachment of the transmission line to the PCB. In addition, there is a minimum diameter that is set by the minimum via diameter that can be supported; hence, even such approximations require substantially more space than a transmission line constructed according to the present invention and are not compatible with the typical pad sizes and pad spacings on an IC.

Signals, from the various ICs and/or other components that are placed on the top surface, connect down into the three-dimensional interconnect structure substrate though shielded coax-like structures formed out of bumps in the ideal case; however, a variety of methods can be used to connect the signals from the ICs to the substrate even conventional wiring bonding. Once in the three-dimensional interconnect structure substrate, these signals can be transmitted to the next IC through fully shielded transmission lines. The multiple layer property of the substrate allows three-dimensional signal routing where fully shielded signals can cross over each other and/or many RF mmWave structures (filters, couplers, etc.) can be folded into small spaces. As the signals pass through the three-dimensional interconnect structure substrate, the signals can be routed through structures that act as filters, couplers, or perform other electrical functions. The addition of integrated resistors and capacitors greatly expands the number of functions that can be performed in the three-dimensional interconnect structure substrate, and removes many of the parasitics associated with discrete resistors and capacitors; thereby, leading to improved system performance. This three-dimensional aspect of the three-dimensional interconnect structure allows many of these functions to be performed underneath the area occupied by ICs on the surface. If correctly shielded ICs are used along with shielded coaxial connections to the three-dimensional interconnect structure, the need for external shielding cavities, commonly used PCBs or traditional microcircuits can be eliminated, and hence, very compact assemblies can be achieved.

In the above-described embodiments, the final circuit includes one or more ICs attached to a three-dimensional interconnect structure according to the present invention. However, the three-dimensional interconnect structure can be useful even without ICs mounted thereon to provide signal routing and connections to non-IC components such as the devices discussed above. For example, a three-dimensional interconnect structure according to the present invention could be utilized to provide shielded coax-like connections to a PCB or other substrate.

In the above-described embodiments the surface through which the first IC connects is referred to as the "top" surface. However, this is just a label and does not imply any particular orientation with respect to the earth. Furthermore, the coaxial conductor could connect to structures off of the interconnect structure through a side wall of the interconnect structure. The use of thick metal layers leads to structures that are thick enough to allow connectors and/or ICs to be mounted on the side walls of the interconnect structure.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A three-dimensional interconnect structure comprising a top surface; a first coaxial conductor filled with a solid dielectric medium, said first coaxial conductor having a segment that runs parallel to said top surface and the segment connects said first coaxial conductor to said top surface; conductive pads on said top surface adapted to receive a signal and couple that signal to said first coaxial conductor at said top surface; and a shielded chamber containing a circuit device connecting two conductors that are part of said three-dimensional interconnect structure to one another in that chamber, said shielded chamber being filled with said solid dielectric medium.

2. The three-dimensional interconnect structure of claim 1 further comprising a second coaxial conductor having a segment running parallel to said top surface and at an oblique angle to said segment of said first coaxial conductor that runs parallel to said top surface, said second coaxial conductor being filled with said solid dielectric medium.

3. The three-dimensional interconnect structure of claim 1 wherein said three-dimensional interconnect structure is a solid block of a mixture of metal structures interspersed with said solid dielectric medium.

4. The three-dimensional interconnect structure of claim 3 wherein said metal structures have a minimum dimension of 550 microns.

5. The three-dimensional interconnect structure of claim 1 wherein said top surface comprises a coaxial shielded IC connection connected to said first coaxial conductor and adapted to couple said first coaxial conductor to an IC connected to said top surface.

6. The three-dimensional interconnect structure of claim 1 wherein said first coaxial conductor has a center conductor that comprises copper.

7. The three-dimensional interconnect structure of claim 6 wherein said first coaxial conductor has an outer conductor that comprises CuW.

8. The three-dimensional interconnect structure of claim 1 wherein said solid dielectric medium has a dielectric constant that is greater than 1 and less than 4.

9. The three-dimensional interconnect structure of claim 1 wherein said solid dielectric medium comprises a dielectric chosen from the group consisting of $SiO_2$, polyimides, BCB polymers, Teflon, porous oxides, doped oxides, and spin-on glass.

10. The three-dimensional interconnect structure of claim 1 wherein said solid dielectric medium comprises a mixture of dielectric materials having a thermal coefficient of expansion between 12 ppm/° C. and 20 ppm/° C., and said first coaxial conductor comprises copper or an alloy thereof.

11. The three-dimensional interconnect structure of claim 10 wherein said mixture of dielectric materials comprises a BCB polymer.

12. The three-dimensional interconnect structure of claim 11 wherein said mixture comprises $SiO_2$.

13. The three-dimensional interconnect structure of claim 11 wherein said mixture comprises a gas entrapped in said BCB polymer.

14. The three-dimensional interconnect structure of claim 1 wherein said circuit device comprises a device chosen from the group consisting of resistors, filters, capacitors, and inductors.

15. The three-dimensional interconnect structure of claim 1 further comprising a bottom surface adapted for connecting an IC to a third coaxial conductor having a segment perpendicular to a bottom surface.

* * * * *

UNITED STATES PATENT AND TRADEMARK OFFICE
CERTIFICATE OF CORRECTION

PATENT NO. : 9,900,985 B2
APPLICATION NO. : 15/366919
DATED : February 20, 2018
INVENTOR(S) : Shirley Page 1 of 1

It is certified that error appears in the above-identified patent and that said Letters Patent is hereby corrected as shown below:

In the Specification

In Column 1, Line 10, delete "32/289,099" and insert -- 62/289,099 --

Signed and Sealed this
Twelfth Day of June, 2018

Andrei Iancu
*Director of the United States Patent and Trademark Office*